United States Patent [19]

Harrington et al.

[11] Patent Number: 5,473,326

[45] Date of Patent: Dec. 5, 1995

[54] HIGH SPEED LOSSLESS DATA COMPRESSION METHOD AND APPARATUS USING SIDE-BY-SIDE SLIDING WINDOW DICTIONARY AND BYTE-MATCHING ADAPTIVE DICTIONARY

[75] Inventors: Gary L. Harrington, Colorado Springs; Thomas M. Mnich, Woodland Park; William D. Miller, Colorado Springs, all of Colo.

[73] Assignee: CERAM Incorporated, Colorado Springs, Colo.

[21] Appl. No.: 972,046

[22] Filed: Nov. 5, 1992

Related U.S. Application Data

[63] Continuation-in-part of Ser. No. 679,530, Apr. 2, 1991, which is a continuation-in-part of Ser. No. 627,722, Dec. 14, 1990, abandoned.

[51] Int. Cl.[6] ................................................. H03M 7/30
[52] U.S. Cl. ................................................. 341/51; 341/106
[58] Field of Search ................................. 341/51, 106, 87, 341/95, 50, 67

[56] References Cited

U.S. PATENT DOCUMENTS

| | | | |
|---|---|---|---|
| 4,628,297 | 12/1986 | Mita et al. | 341/106 |
| 4,843,389 | 6/1989 | Lisle et al. | 341/106 |
| 4,881,075 | 11/1989 | Weng | 341/51 X |
| 5,006,849 | 4/1991 | Baarman et al. | 341/106 |
| 5,008,668 | 4/1991 | Takayama et al. | 341/106 |
| 5,138,316 | 8/1992 | Konishi | 341/106 X |
| 5,243,341 | 9/1993 | Seroussi et al. | 341/51 |

*Primary Examiner*—Marc S. Hoff
*Attorney, Agent, or Firm*—Beaton & Folsom

[57] ABSTRACT

A data compression and decompression method and apparatus utilizing a sliding window dictionary in combination with an adaptive dictionary. Incoming data moves through a buffer and is compared against both the sliding window dictionary and the adaptive dictionary, and matched data is replaced with a pointer to the dictionary entry. All incoming data is entered into the sliding window dictionary, but only data which satisfies certain criteria is entered into the adaptive dictionary.

27 Claims, 3 Drawing Sheets

HIGH SPEED LOSSLESS DATA COMPRESSION METHOD AND APPARATUS USING SIDE-BY-SIDE SLIDING WINDOW DICTIONARY AND BYTE-MATCHING ADAPTIVE DICTIONARY

This application is a continuation-in-part of application no. 679,530 filed Apr. 2, 1991 by William D. Miller, Gary L. Harrington, Larry Fullerton, E. J. Weldon, Jr. and Christopher M. Bellman for Solid-State RAM Data Storage for Virtual Memory Computer Using Fixed-Size Swap pages, which is a continuation-in-part of application Ser. No. 627,722 filed Dec. 14, 1990 abandoned by William D. Miller, Gary L. Harrington and Lawrence M. Fullerton for Storage of Compressed Data on Random Access Storage Devices, both of which are assigned to CERAM, Inc., the assignee of the present invention. The disclosures of the parent applications are hereby incorporated herein by this reference.

FIELD OF THE INVENTION

The present invention relates to the field of digital data storage and retrieval, and more particularly to the field of lossless data compression and data decompression in the storage and retrieval of data using adaptive dictionaries. The invention is especially useful in the storage of data in solid state memories.

BACKGROUND OF THE INVENTION

Data compression is the reversible encoding of data into a more compact expression which permits more efficient storage and transmission of the data. Some data compressing procedures result in the loss of some of the data upon uncompression; when the data is compressed and then uncompressed, it no longer matches the original data exactly. These so-called "lossy" compression schemes are commonly used for video image data or audio data, where some loss of information can be tolerated or perhaps not even noticed. For example, lossy compression is used extensively in video image compression for multimedia computing and also high-definition television. Although lossy compression loses some of the data, it is highly effective in achieving compression, with compression ratios of 20-to-1 and up to 200-to-1.

Other compression algorithms are "lossless" in that the data can be compressed and then uncompressed, and the resulting output matches the original input exactly. Lossless compression is the only acceptable procedure for compressing information or program data in which losses are not tolerable. Such information and program data constitute the great majority of information and program data outside of the field of video and audio applications. The demands for lossless compression usually result in much lower compression ratios as compared to lossy compression, with ratios of 1.5-to-1 and up to 10-to-1 being typical. The present invention is concerned with lossless data compression.

Most data compression systems used today rely on the fact that sets of data are typically repetitious in limited ways. For example, data such as ASCII files contain byte streams representing alphanumeric symbols, words and phrases that appear repeatedly in the text. By replacing the byte streams with abbreviated byte streams, the data can be compressed considerably. This is generally accomplished using a "dictionary" containing the abbreviations for the byte streams that are to be compressed. The value of using a fixed dictionary is diminished, however, as the size of the dictionary increases, because the savings achieved in compressing the data becomes offset by the expense of comparing the data to a large dictionary. Therefore, the ideal dictionary is limited in scope to contain only those byte streams that are seen often enough in the data to justify the comparison with the dictionary.

Early theoretical work on the use of dictionary compression encoding was done by Jacob Ziv and Abraham Lempel and is described in their article "On Complexity of Finite Sequences", IEEE Transactions on Information Theory, 22:1 (1976) 75–81. The Ziv and Lempel work developed the idea of "adaptive dictionaries" in which the content of the dictionary and hence the compression scheme for future encoding is based on the recent data output. Therefore, the dictionary is adaptive to the data itself. The many compression techniques based on the theoretical work of Ziv and Lempel are commonly referred to as Lempel-Ziv coding or LZ coding, and the essence of those techniques is that byte streams are replaced with pointers to where the byte streams occurred earlier.

An example of LZ coding is presented in an article by J. A. Storer entitled "Textual Substitution Techniques for Data Compression", *Combinational Algorithms on Words* (edited by A. Apostolico and Z. Galil) Springer-Verlag, Berlin, p. 120–121, 1985. In the Storer technique, an encoder and decoder are provided with a fixed amount of memory for use as a dictionary containing a number of dictionary entries. Each entry has a unique pointer associated with it. As data is received, the encoder finds the longest string of characters in the data that matches an entry in the dictionary, transmits the pointer associated with the matched entry in place of the string of characters, updates the dictionary, and if the dictionary is full then deletes one of the entries.

Other examples of LZ coding are found in U.S. Pat. Nos. 4,876,541 by Storer (and the references discussed and cited therein), 5,003,307 by Whiting et al., 4,847,619 by Kato et al., and 4,701,745 by Waterworth.

One of the principal variables in LZ coding which tends to distinguish the many variations of that technique from one another, is the way in which the dictionary is established and updated. Some techniques utilize a sliding window dictionary in which the incoming data are compared against the data in a window sliding over a fixed number N of previous bytes of data. Thus the dictionary in this approach is actually a sequential portion of the text itself. This is sometimes called LZ 77 or LZ 1 coding.

LZ 77 coding can give good data compression provided that the dictionary window is long enough, such as 8K bytes. Common words and fragments will often be matched wholly or partially by a sliding window dictionary of that length. With respect to less common words and fragments, the sliding window dictionary takes advantage of the fact that these less common words and fragments are often concentrated in a single portion of the text. Unusual words are often used repeatedly in a brief portion of text to discuss a single concept, rather than scattered through a long text.

The principle disadvantage to sliding window dictionaries as used in LZ 77 coding is not that they are ineffective in achieving good compression, for they are indeed effective in achieving good compression. The principal disadvantage to sliding window dictionaries is that they require a large and constant amount of time for performing the encoding because of the relatively large window length. The encoding speed can be increased by using various known data structures, but that also increases the required memory. LZ 77 coding is relatively fast at the decoding step, however, and so it is suitable for applications which require only one encoding on a fast computer with large amounts of memory and multiple decoding, as commonly is the case with on-line help files, and electronic books.

Other techniques in LZ coding replace the sliding window dictionary with a true adaptive dictionary which accumulates phrases found in the incoming data under the broad assumption that phrases that occur once are likely to occur again. By using known data structure and hashing techniques, the comparison of the incoming data to the entries in the adaptive dictionary can be done relatively quickly. Adaptive dictionaries also have an advantage over sliding window dictionaries in that the adaptive dictionaries may include entries generated much earlier than the current incoming data, while the entries in a sliding window dictionaries are limited to the span of the window. The main drawback to adaptive dictionaries is that once the limited adaptive dictionary is full, no further entries can be made without deleting some of the existing entries. While the dictionary can be made very large so that it accommodates a large number of entries before being filled, this increases memory requirements and comparison times.

SUMMARY OF THE INVENTION

The present invention is a very high speed lossless data compression and decompression system using a sliding window dictionary simultaneously with an adaptive dictionary. In the preferred embodiment, there is a 36-byte lookahead buffer, a 256-byte sliding window dictionary, and a 32-byte adaptive dictionary. The adaptive dictionary accepts data from the input stream at the same time as the sliding window dictionary.

In the preferred embodiment, all input data flows into and out of the sliding window dictionary, such that the compression of the input data with the sliding window dictionary involves comparison with only a fixed length of data immediately preceding the compared input data. For any input data that form a multiple-byte match with entries in the sliding window, a pointer is substituted for the matched byte-string. Any bytes of input data that does not form part of a multiple-byte match with the sliding window, are compared against the entries in the adaptive dictionary. If a match is found with the entries in the adaptive dictionary, then a pointer is substituted for the matched data. If no match is found in the adaptive dictionary, then the data is entered into the adaptive dictionary with the rationale that the data may occur again in the incoming data and then form a match against the adaptive dictionary. When the adaptive dictionary is full, old entries are deleted to make room for the new ones.

Accordingly, it is an object of the present invention to provide a lossless data compression coding system utilizing both a sliding window dictionary and adaptive dictionary in combination whereby data compression can be accomplished quickly and with a minimum amount of memory.

It is a further object of the invention to provide a system in which entries are made in the adaptive dictionary only if they satisfy particular criteria, such as being data no more than a fixed number of bytes in length and not being already in the sliding window dictionary.

A further object of the invention is to provide a system for updating an adaptive dictionary to accommodate new entries by deleting existing entries as necessary to accommodate new entries.

DESCRIPTION OF THE PREFERRED EMBODIMENTS

Figure 1:
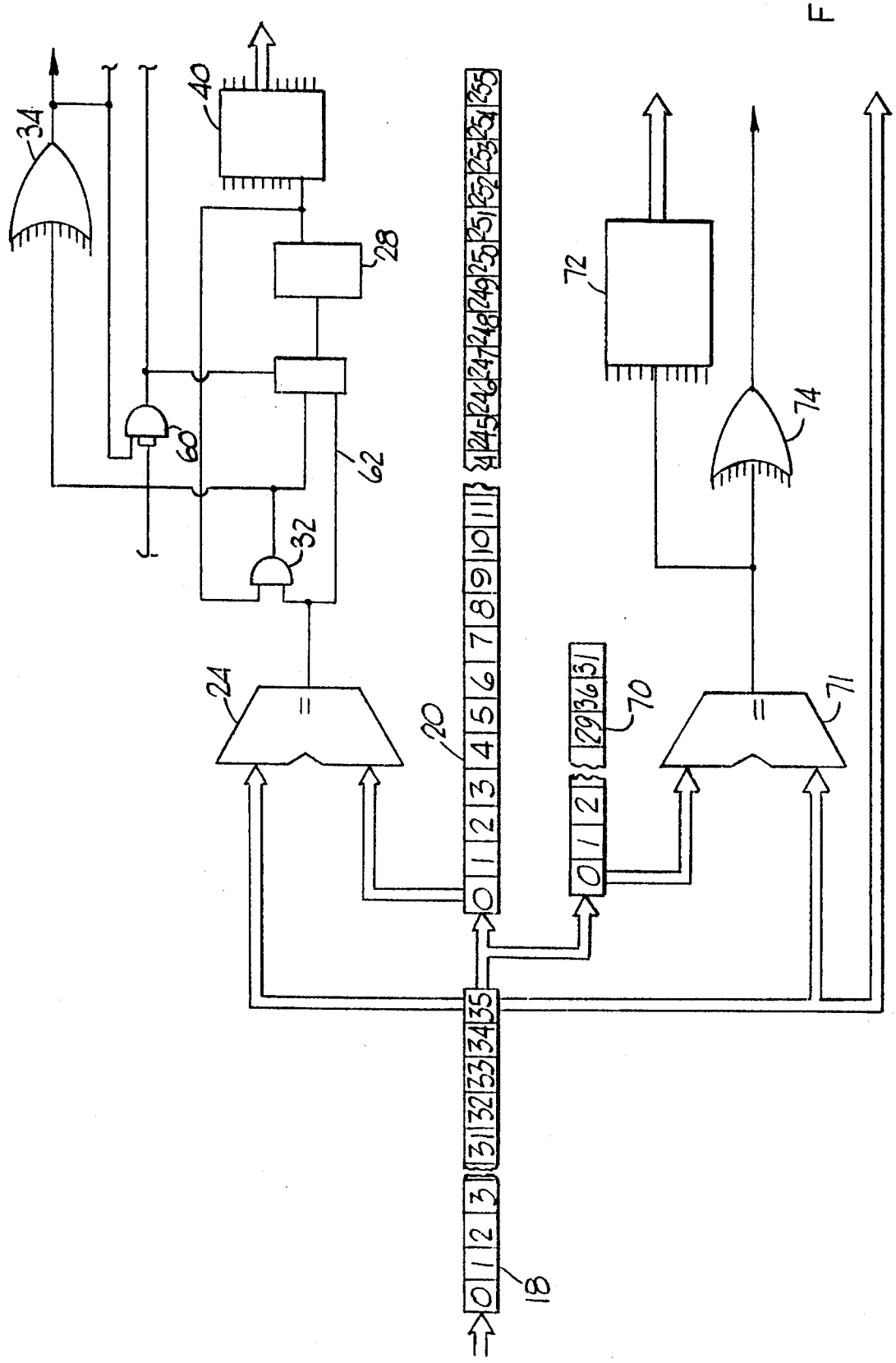
FIG. 1 is a diagrammatic flow chart of the compression process of the present invention, which overlaps with FIG. 2.
Figure 2:
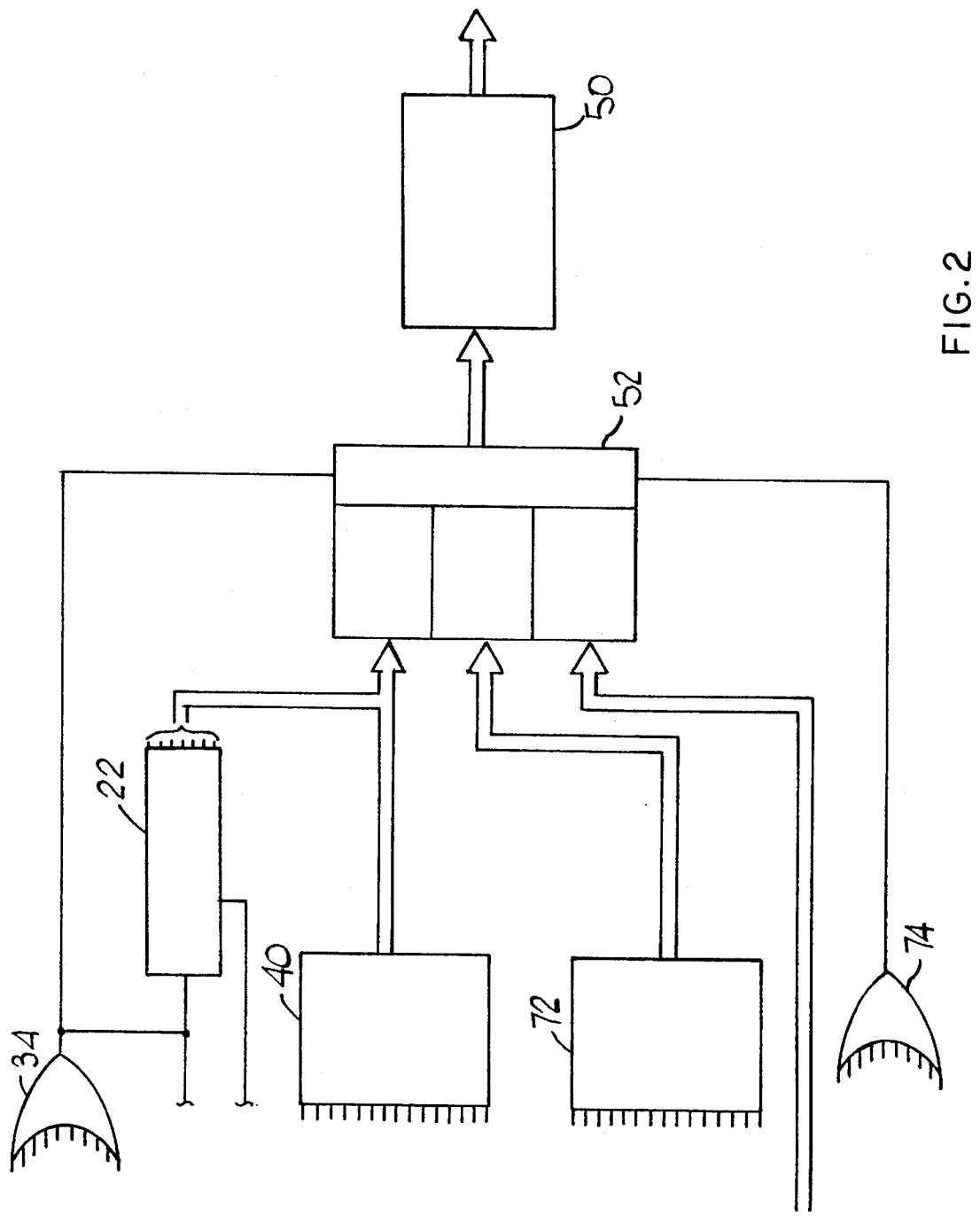
FIG. 2 is a diagrammatic flow chart of the compression process of the present invention, which overlaps with FIG. 1.

A block diagram of the data compression system of the present invention is shown in FIGS. 1 and 2. The system includes a lookahead buffer 18 in the form of a linear array of bytes from an oldest byte to a newest byte which receives the incoming data. The lookahead buffer 18 is actually a single byte in length, but can be visualized as being 36-bytes long since that is the number of bytes that can be matched against the sliding window 20 in a single string match in the manner described below. The incoming data is clocked into the input end of the buffer 18 and out of the output end sequentially, one byte per clock cycle. The sliding window dictionary 20 — sometimes referred to as a first comparison window herein — is also a linear array of bytes from an oldest byte to a newest byte. The sliding window dictionary 20 receives the output of the lookahead buffer a byte at a time, so that the input data moves sequentially a byte at a time through the lookahead buffer and then through the sliding window buffer. In the preferred embodiment, the sliding window 20 is 256 bytes long, although it will be appreciated that windows of other lengths are possible as well.

If the byte in the lookahead buffer 18 matches a byte in the sliding window dictionary 20, a counter 22 is incremented to indicate a match length of one. Regardless of whether or not there was a match, the byte shifts through the lookahead buffer and into the sliding window dictionary 20. There is a separate sliding window byte comparator 24 for each of the 256 bytes in the sliding window dictionary 20. For each byte in the window 20 that matches the byte in the lookahead buffer 18, the flip flop 28 is set to indicate a match at that window location. As more bytes are shifted into the lookahead buffer 18 and compared against the sliding window 20, the flip flop 28 keeps track of which bytes in the window 20 still match the lookahead buffer 18. The matched string can be as long as the length of the lookahead buffer, namely 36 bytes. If any input byte does not match the sliding window 20, the output of the sliding window byte comparator 24 for that position goes into AND gate 32 and causes flip flop 28 for that position to get turned off. When flip flop 28 gets turned off, the feedback from the output of flip flop 28 back to the upper input of AND gate 32 will ensure that the flip flop will stay off during the remainder of the string match operation, indicating that there is no longer a string match at that position. If the input byte still matches at a position it matched before, AND gate 32 causes the flip flop 28 for that position to continue being set, indicating a multiple-byte match at that position.

Input bytes are continually compared against data in the sliding window dictionary 20 until the output of OR gate 34 goes off, indicating the end of the string match. When the output of OR gate 34 goes off, and before the next clock edge, the outputs of all flip flops 28 go into a priority encoder to get a pointer to the position in the window of the longest match just before the non-matching byte came into the lookahead buffer 18. Then on the next clock edge after OR gate 34 went off indicating the end of the string match, the encoded position from encoder 40 and the match count from counter 22 are latched into the output stage of the compressor, shown as bit packer 50, through the multiplexer 52 according to the method of encoding explained below. Simultaneously, the 'off' output of OR gate 34 goes through gate 60 to multiplexer 62, causing the raw, ungated output of byte comparator 24 to be clocked into flip flop 28 on the same clock edge that latched the encoded string match output. By bypassing gate 32, multiplexer 62 causes flip flop 28 to latch a new byte comparison result which does not depend on the previous state of the flip flop which is at that time the final result of the previous string match. This starts a new string match with zero delay; a new string match process starts on the same clock edge that latches the results of the previous string match.

At the start of a new string match, the adaptive dictionary 70 — sometimes referred to as a second comparison window herein — is checked for a match against the byte in lookahead buffer 18. As in the case of the buffer 18 and the sliding window dictionary 20, the adaptive dictionary 70 is a linear array of bytes from an oldest byte to a newest byte. The comparison is accomplished using the adaptive dictionary comparator 71 which has a separate compare circuit for each of the 32 bytes in the adaptive window. If there is a byte match somewhere in adaptive dictionary 70, then the match is encoded in encoder 72 with the compact format explained below. The output encoding of the single-byte match against adaptive dictionary 70 is latched into the output stage of the compressor, shown as bit packer 50, through multiplexer 52 on the next rising edge of the clock.

The byte comparisons of lookahead byte 18 against all bytes in sliding window dictionary 20 occur simultaneously with the byte comparisons of lookahead byte 18 against all bytes in adaptive dictionary 70. The output results of the comparisons against the two separate dictionaries go to output multiplexer via OR gates 34 and 74, allowing the output stage of the compressor to select the appropriate compression output based on where the match occurred. The selection of encoded output from either dictionary can be done on a clock-by-clock basis, so that there is zero delay switching between dictionaries to always give the best compression ratio possible based on the two separate, side-by-side dictionaries. A multiple-byte string match against sliding window dictionary 20 always has priority over a single-byte match in adaptive dictionary 78, since a multiple-byte match will always give a better compression ratio. Single-byte matches against the small adaptive dictionary have priority over single-byte matches against the large sliding window dictionary because of the smaller, more compact encoding of adaptive dictionary matches.

The output encoding depends on whether the match of the incoming data is with the sliding window dictionary 20 or with the adaptive dictionary 70. If the data is uncompressible, the coding will indicate a raw 8 bit byte, as in:

Obbbbbbbb

If the incoming data has been matched with the 32-byte adaptive dictionary, then the encoding will be:=ps 10<pointer>

The "10" indicates the adaptive dictionary while the pointer is a 5-bit binary number pointing to one of the 32-byte entries in the adaptive dictionary.

If the data has been matched with the 256-byte sliding window dictionary instead of the adaptive dictionary, then the encoding will be:

11<pointer><length>

The "11" indicates the sliding window dictionary, the pointer is an 8-bit binary number pointing to the byte in the 256-byte sliding window dictionary at which the match begins, and the length indicates the length of the match in bytes. In a preferred embodiment, the length is indicated in a modified binary code to save bits, according to the following table:

| | |
|---|---|
| 01 | 2 bytes |
| 10 | 3 bytes |
| 11 | 4 bytes |
| 0000000 | 5 bytes |
| 0000001 | 6 bytes |
| 0000010 | 7 bytes |
| 0000011 | 8 bytes |
| 0000100 | 9 bytes |
| 0000101 | 10 bytes |
| 0000110 | 11 bytes |
| 0000111 | 12 bytes |
| 0001000 | 13 bytes |
| 0001001 | 14 bytes |
| 0001010 | 15 bytes |
| 0001011 | 16 bytes |
| 0001100 | 17 bytes |
| 0001101 | 18 bytes |
| 0001110 | 19 bytes |
| 0001111 | 20 bytes |
| 0010000 | 21 bytes |
| 0010001 | 22 bytes |
| 0010010 | 23 bytes |
| 0010011 | 24 bytes |
| 0010100 | 25 bytes |
| 0010101 | 26 bytes |
| 0010110 | 27 bytes |
| 0010111 | 28 bytes |
| 0011000 | 29 bytes |
| 0011001 | 30 bytes |
| 0011010 | 31 bytes |
| 0011011 | 32 bytes |
| 0011100 | 33 bytes |
| 0011101 | 34 bytes |
| 0011110 | 35 bytes |
| 0011111 | 36 bytes |

Instead of the comparators 24 and 71 described above, in which there is a separate compare circuit for each byte of the sliding window dictionary and adaptive dictionary, respectively, and only one byte of the lookahead buffer 18 is compared at a time, a large number of bytes of the lookahead buffer 18 could be compared at a given time in a "gang compare" cycle. For example, at least in theory, all 36-bytes of the lookahead buffer 18 could be compared. Also, the number of bytes in the lookahead buffer 18 could be increased or decreased to allow longer or shorter string matches with appropriate adjustment of the length of the output pointer symbols. Similarly, the length of the sliding window dictionary 20 or adaptive dictionary could be increased or decreased with appropriate changes to the memory and the length of the output pointers.

The dictionaries 20 and 70 are updated in the following manner. As already mentioned, all input bytes are clocked through the sliding window dictionary 20 on a byte-by-byte basis. Therefore, the sliding window dictionary is updated by a single byte shift each clock period. In contrast, not all input bytes are entered into the adaptive dictionary 70. Adaptive dictionary 70 can be made smaller than sliding window dictionary 20 and still give a good compare hit rate against input bytes because adaptive dictionary 70 is selective in which input bytes it allows to shift in. Only input bytes which do not become part of a multiple-byte match against sliding window dictionary 20, and which are not already in adaptive dictionary 70, are allowed to shift into the adaptive dictionary. The idea is that if a byte is not part of a multiple-byte match against the sliding window, it is put into the adaptive dictionary (if it is not already there) because there is a very good chance that that byte value may occur again in the input stream and again not fit into a multiple-byte match. In that case, it will match against the small adaptive dictionary and give a small amount of compression. Prior art compression algorithms put out a no-compress encoding for an input byte that is not part of a multiple-byte match; in contrast with the present invention, a no-compress encoding will give a small amount of expansion instead of compression. When the dictionaries are full, old entries must be deleted to make room for new entries. Each time there is a new entry, the oldest entry is deleted and the remaining entries are shifted one byte along the linear array to open a byte position for the new entry.

The current invention, with its two side-by-side dictionaries gives better compression over a range of various types of computer data, whereas prior art data compressors with a single dictionary give good compression on some types of data and poor or not-so-good compression on other types of data.

Figure 3:
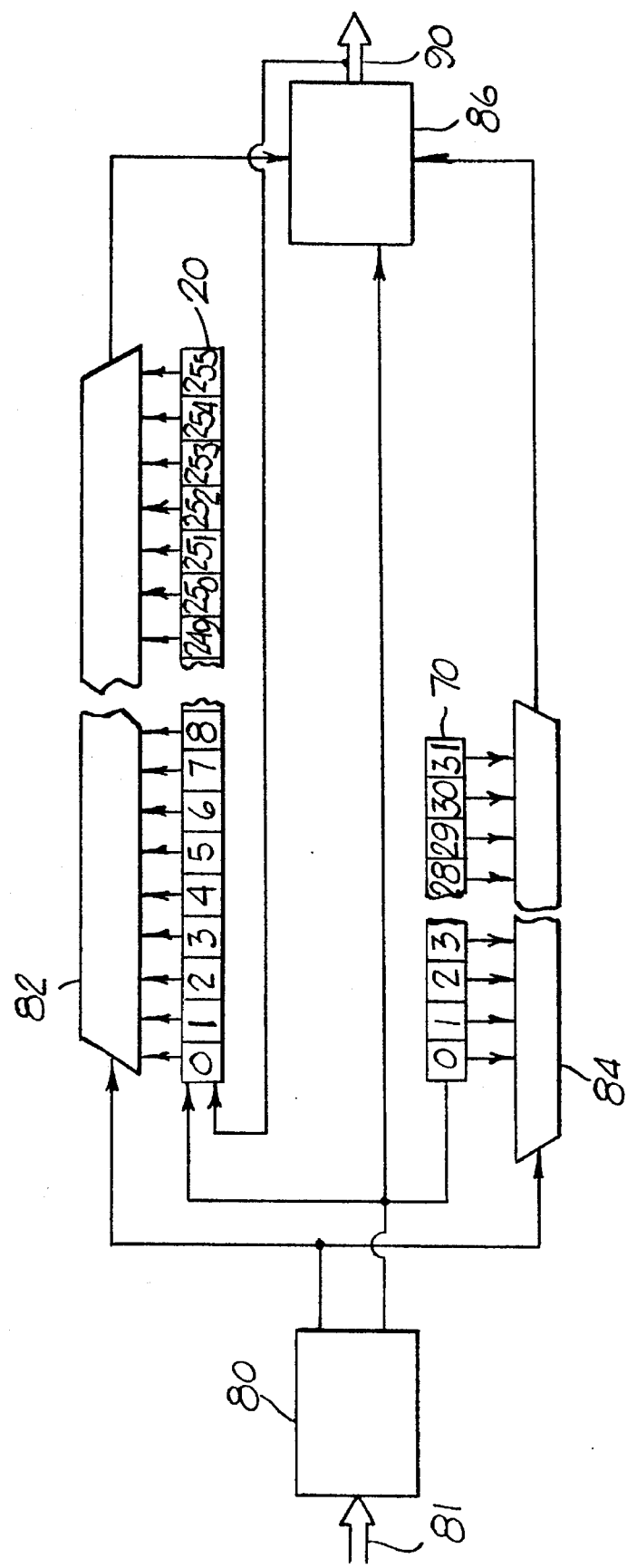
FIG. 3 is a diagrammatic flow chart of the decompression process of the present invention.

Decompression of previously-compressed data is simple, straightforward, and fast, as shown in FIG. 3. Compressed data 81 is parsed in parser 80, which sends a pointer address to either selector 82 to select 1 of 256 bytes from the sliding window dictionary, or to selector 84 to select 1 of 32 bytes from the separate adaptive dictionary. Selector 86 would then pass one of the two selected dictionary bytes on the decompression output 90, which is where the decompressed data is available for the computer system that needs it. The uncompressed byte would also shift into the sliding window dictionary 20 to recreate the same dictionary that was created during compression. For a multiple-byte match, as the uncompressed data entering the sliding window dictionary 20 shifts the contents of the sliding window dictionary, each byte of the string match that is being uncompressed can be read out at the same pointer address within the sliding dictionary.

If the incoming word of previously-compressed data is a raw byte of data as described by the raw bit format discussed previously, then parser 80 would pass the raw byte on to selector 86 which would pass the raw byte on to the output 90. The raw byte would also shift into a sliding window dictionary 20. Only uncompressed data which comes from the "raw" encoding format would shift into the separate adaptive dictionary 70, to recreate an exact copy of the adaptive dictionary that was created when the data was originally compressed.

We claim:

1. A method for compressing a byte stream of input data, comprising: establishing a multiple-byte buffer and sequentially transferring bytes from said byte stream into said buffer; establishing a multiple-byte first comparison window and sequentially transferring bytes from said byte stream into said first comparison window; establishing a multiple-byte second comparison window to receive some but not all of the bytes from said byte stream; comparing a byte in the buffer against the bytes in the first comparison window and the second comparison window; substituting a pointer for the compared byte in the buffer if the compared byte matches a byte in the first or second comparison window; and outputting said substituted pointer into an output stream.

2. The method of claim 1, wherein said second comparison window receives bytes from said byte stream, only if said byte is not part of a multiple-byte match against the first comparison window.

3. The method of claim 2, wherein the second comparison window receives bytes from said byte stream, only if said byte is not then in the second comparison window.

4. The method of claim 3, wherein the second comparison window includes bytes transferred from the byte stream and received by the second comparison window, arranged in a linear array of byte positions from an oldest received byte to a newest received byte, and when a new byte is received the oldest byte is deleted and the other bytes are shifted one byte position toward the oldest byte position to open the newest byte position for the new byte.

5. The method of claim 2, wherein the buffer includes bytes transferred from the byte stream and received by the buffer, arranged in a linear array of byte positions from an oldest received byte to a newest received byte; wherein the byte in the buffer that is compared against the bytes in the first comparison window and the second comparison window is the byte in the oldest byte position.

6. The method of claim 5, further comprising the steps of: deleting said compared byte from the buffer and shifting the buffer bytes one position toward the oldest position to establish another oldest received byte and to open the newest byte position, and adding a new byte from said byte stream to the newest position upon completion of said comparison; comparing said another oldest byte against the bytes in the first comparison window and the second comparison window; substituting a pointer for the compared byte in the buffer if the compared byte matches a byte in a comparison window; outputting said substituted pointer into an output stream; and repeating said steps until all the bytes in the byte stream have been compared with the bytes in the comparison windows.

7. The method of claim 6, wherein the first comparison window includes bytes transferred from the byte stream and received by the first comparison window, arranged in a linear array of byte positions from an oldest received byte to a newest received byte; and wherein when a new byte is received by the first comparison window the oldest byte is deleted and the other first comparison window bytes are shifted toward the oldest byte position to open the newest byte for the newest byte position.

8. The method of claim 7, wherein the bytes in the buffer and the first comparison window are arranged such that the bytes in the buffer array together with the bytes in the first comparison window array constitute a continuous segment of the byte stream.

9. The method of claim 6, further comprising substituting for a series of more than one consecutive buffer bytes, a symbol indicating the number of consecutive buffer bytes that were matched with first comparison window bytes.

10. The method of claim 1, further comprising uncompressing the output stream by utilizing said pointers to locate a byte in a comparison window, and substituting said located byte for the pointer.

11. The method of claim 1, wherein the first comparison window contains approximately 256 bytes.

12. The method of claim 1, wherein the second comparison window contains approximately 32 bytes.

13. The method of claim 1, wherein the substituted pointer includes a symbol to indicate which of the comparison windows contains said match and a symbol to indicate a location of said match in said comparison window.

14. The method of claim 13, wherein a substituted pointer to indicate a match in the first comparison window includes a symbol to indicate a length of the match.

15. The method of claim 14, wherein said symbol to indicate the length of the match is a binary symbol in which a two-byte length is indicated by 01, a three-byte length is indicated by 10, a four-byte length is indicated by 11, and a length of more than four-bytes is indicated by 00 together with a string of at least five bits.

16. The method of claim 1, wherein the comparison of a byte against the bytes in the first comparison window is done simultaneously with the comparison of the same byte against the bytes in the second comparison window.

17. The method of claim 16, wherein a result of the comparison of a byte against the bytes in the first comparison window is encoded to establish said pointer simultaneously with the comparison of said byte against the bytes in the second comparison window.

18. The method of claim 17, wherein each byte of said byte stream is replaced with a substituted pointer indicating a match in one of said comparison windows.

19. A system for compressing a byte stream of input data, comprising a buffer having at least one byte position; a first comparison window having at least one byte position; a second comparison window having at least one byte position; means for comparing a byte in the buffer against bytes in the comparison windows to determine a matching byte in the first comparison window or the second comparison window; means operatively connected to the comparison windows for generating a pointer indicating the location in a comparison window of the matched byte in the comparison window; means for substituting the pointer for the matched byte in the buffer; and means for updating the comparison windows whereby the first comparison window receives each byte in the byte stream sequentially and the second comparison window receives only those bytes in the byte stream that satisfy pre-established conditions.

20. The system of claim 19, wherein the buffer includes a plurality of buffer byte positions for bytes transferred sequentially from the byte stream and received by the buffer, the buffer byte positions being arranged in a linear array from an oldest received buffer byte position to a newest received buffer byte position, and further comprising means for updating the buffer by deleting the buffer byte in the oldest buffer byte position and shifting the other buffer bytes toward the oldest buffer byte position to open the newest buffer byte position and transferring a byte from the byte stream into the newest buffer byte position.

21. The system of claim 20, wherein the first comparison window includes a plurality of first comparison window byte positions arranged in a linear array from an oldest received first comparison window byte position to a newest received first comparison window byte position, and wherein said comparison window updating means includes means for deleting a first comparison window byte in the oldest position and shifting the other first comparison window bytes toward the oldest first comparison window byte position to open the newest first comparison window byte position, and transferring a deleted buffer byte into said open newest first comparison window byte position.

22. The system of claim 21, further comprising means for generating a length of match symbol if a plurality of consecutive buffer bytes match first comparison window bytes, whereby the length of match symbol indicates the number of bytes in said plurality of consecutive buffer bytes.

23. The system of claim 22, wherein said preestablished conditions include at least one of the conditions that the bytes to be received by the second comparison window do not match any plurality of consecutive bytes in the first comparison window and that the byte to be received by the second comparison window is not already in the second comparison window.

24. The system of claim 23, wherein the second comparison window includes a plurality of second comparison window byte positions arranged in a linear array from an oldest received second comparison window byte position to a newest received second comparison window byte position, and wherein said comparison window updating means includes means for deleting the byte in the oldest second comparison window byte position and shifting the other second comparison window bytes toward the oldest second comparison window byte position to open the newest second comparison window byte position, and transferring into said newest second comparison window byte positioned a byte satisfying said condition.

25. The system of claim 24, further comprising means for establishing a compressed data output including said pointer and symbol.

26. The system of claim 25, further comprising data uncompressing means for uncompressing the compressed data output whereby the uncompressed output is substantially the same as the byte stream of input data.

27. The system of claim 26, wherein said uncompressing means includes means for utilizing said pointer to locate a byte in a comparison window, and for substituting said byte for said pointer.

* * * * *